(12) United States Patent
Kim

(10) Patent No.: US 11,467,747 B2
(45) Date of Patent: Oct. 11, 2022

(54) DATA STORAGE DEVICE AND OPERATING METHOD THEREOF

(71) Applicant: SK hynix Inc., Gyeonggi-do (KR)

(72) Inventor: Su Kyung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 27 days.

(21) Appl. No.: 17/249,770

(22) Filed: Mar. 12, 2021

(65) Prior Publication Data

US 2022/0050594 A1 Feb. 17, 2022

(30) Foreign Application Priority Data

Aug. 13, 2020 (KR) .......................... 10-2020-0101652

(51) Int. Cl.
*G06F 3/06* (2006.01)

(52) U.S. Cl.
CPC ............ *G06F 3/064* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 2011/0145483 A1* | 6/2011 | Sudo ................... | G06F 12/0246 711/E12.001 |
| 2013/0212320 A1* | 8/2013 | Lee ..................... | G06F 12/0246 711/103 |
| 2017/0364298 A1* | 12/2017 | Choi .................... | G06F 3/0616 |
| 2018/0285562 A1* | 10/2018 | Radhakrishnan ..... | G06F 21/554 |
| 2018/0341418 A1* | 11/2018 | Ki ......................... | G06F 3/0619 |
| 2020/0126624 A1* | 4/2020 | Kim .................... | G11C 11/5635 |

FOREIGN PATENT DOCUMENTS

| KR | 10-2014-0145063 | 12/2014 |
|---|---|---|
| KR | 10-2050729 | 12/2019 |

* cited by examiner

*Primary Examiner* — Kevin Verbrugge
(74) *Attorney, Agent, or Firm* — IP & T Group LLP (57) ABSTRACT

A data storage device includes storage including a plurality of memory blocks and a controller configured to control operations of the plurality of memory blocks. The controller is configured to calculate a stress value of each of the plurality of memory blocks based on an erase completion count and an erase interruption count of the corresponding memory block.

20 Claims, 8 Drawing Sheets

| BLK NO | EC | SC | SPOC (N) |
|---|---|---|---|
| 1 | 20 | 30 | 1.4 |
| 2 | 12 | 5 | 0 |
| 3 | 15 | 20 | 2.7 |
| 4 | 3 | 1 | 1 |
| ⋮ | ⋮ | ⋮ | ⋮ |
| n-1 | 17 | 0 | 0 |
| n | 10 | 2 | 0.8 |

| BLK NO | EC | SC | SPOC (N) |
|---|---|---|---|
| 1 | 20 | 30 | 1.4 |
| 2 | 12 | 5 | 0 |
| 3 | 15 | 20 | 2.7 |
| 4 | 3 | 1 | 1 |
| ⋮ | ⋮ | ⋮ | ⋮ |
| n-1 | 17 | 0 | 0 |
| n | 10 | 2 | 0.8 |

DATA STORAGE DEVICE AND OPERATING METHOD THEREOF

CROSS-REFERENCE TO RELATED APPLICATION

The present application claims priority under 35 U.S.C. § 119(a) to Korean Patent Application Number 10-2020-0101652, filed on Aug. 13, 2020, in the Korean Intellectual Property Office, which is incorporated herein by reference in its entirety.

BACKGROUND

1. Technical Field

Various embodiments generally relate to a semiconductor integrated device, and more particularly, to a data storage device and an operating method thereof.

2. Related Art

Storage devices may be coupled to a host device to perform a data input/output operation in response to a request of the host device. The storage devices may employ various storage media to store data.

Flash memory devices represent on type of data storage medium. With their increased capacity and improved price competitiveness, flash memory devices are used in data centers which process large amounts of data, in addition to personal computers (PCs) or mobile devices.

Flash memory devices may not perform overwrite or in-place updating, and may perform a read/write operation in a unit different from that used in an erase operation. Flash memory devices also have limited program/erase cycles.

Due to such characteristics, a flash memory device may have a limited lifespan, and thus there is a need for a method of securing reliability.

To secure reliability, a method of leveling the number of erase operations performed in memory blocks using a wear-leveling scheme has been used.

SUMMARY

In an embodiment of the present disclosure, a data storage device may include: storage including a plurality of memory blocks; and a controller configured to control operations of the plurality of memory blocks. The controller may be configured to calculate a stress value applied to each of the plurality of memory blocks based on an erase completion count and an erase suspend count of the memory block.

In an embodiment of the present disclosure, an operating method of a data storage device which includes storage including a plurality of memory blocks and a controller configured to control operations of the plurality of memory blocks, the method may include: the controller executing an erase operation for at least one memory block; the controller counting an erase suspend count for the memory block as the erase operation is suspended according to occurrence of interruption during erase of the memory block; the controller processing the interruption and resuming the erase operation; the controller counting an erase completion count for the memory block; and the controller calculating a stress value applied to the memory block based on the erase completion count and the erase suspend count of the memory block.

According to the technology, a stress variation substantially applied to the memory blocks may be minimized, and thus the lifespan of the storage may be extended.

These and other features, aspects, and embodiments are described in more detail below.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention are described in detail with reference to the accompanying drawings. The drawings are schematic and block illustrations of various embodiments (and intermediate structures). As such, the drawings are not intended to indicate actual configurations and shapes of elements and components, which may vary. Moreover, the drawings are not intended to limit the invention to any particular configuration or structure.

Although a few embodiments of the present invention are shown and described, it will be appreciated by those of ordinary skill in the art that changes may be made in any of these embodiments without departing from the principles and spirit of the present teachings. The present invention is intended to cover all such changes.

Also, throughout the specification, reference to "an embodiment," "another embodiment" or the like is not necessarily to the same embodiment, and different references to any such phrase are not necessarily to the same embodiment(s). The term "embodiments" when used herein does not necessarily refer to all embodiments.

Figure 1:
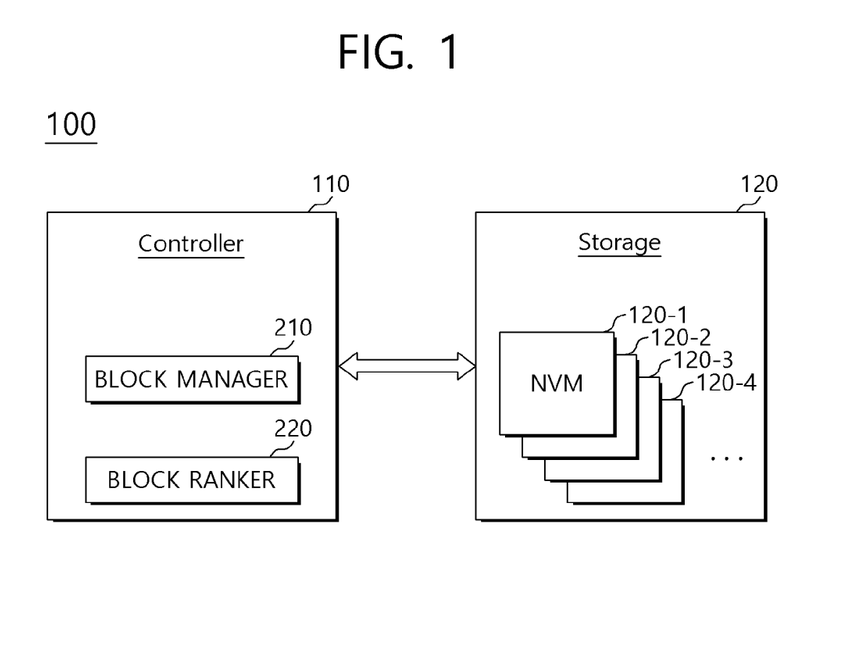
FIG. 1 is a diagram illustrating a configuration of a data storage device according to embodiments of the present disclosure.

FIG. 1 is a diagram illustrating a configuration of a data storage device 100 according to an embodiment.

Referring to FIG. 1, the data storage device 100 may include a controller 110 and storage 120.

The controller 110 may be configured to communicate with the storage 120. The controller 110 may write data transmitted from a host device (not shown) in the storage 120 or transmit data read out from the storage 120 to the host device, in response to a request of the host device. The controller 110 may control various operations for managing the storage 120 even in the absence of instruction from the host device.

The storage 120 may write data or output stored data according to control of the controller 110. The storage 120 may be configured as a volatile memory device or a nonvolatile memory device. In an embodiment, the storage 120 may be implemented with any of various nonvolatile memory devices such as an electrically erasable and programmable read only memory (EEPROM), a NAND flash memory, a NOR flash memory, a phase-change random access memory (PRAM), a Resistive RAM (ReRAM), a ferroelectric RAM (FRAM), a spin torque transfer magnetic RAM (STT-MRAM), and the like. In an embodiment, the storage 120 may include a plurality of nonvolatile memory devices (NVM) 120-1, 120-2, 120-3, 120-4, each of which may include a plurality of dies, a plurality of chips, or a plurality of packages. Each of dies, chips, or packages may include a plurality of memory blocks. Super blocks may be configured by grouping the plurality of memory blocks into super block units, and the controller 110 may control operations of the memory blocks in a given super block as a unit.

Memory cells constituting the storage 120 may operate as a single-level cell (SLC) in which one-bit data is to be stored in one memory cell or a multi-level cell (MLC) in which multi-bit data is to be stored in one memory cell through the multi-leveling technique.

The controller 110 may include a block manager 210 and a block ranker 220.

The block manager 210 may manage a wear level for each of the plurality of memory blocks constituting the storage 120. The block manager 210 may manage the wear level, to which stress applied to the memory block in an erase operation is reflected, based on an erase count and an erase interruption count of the memory block.

The block manager 210 may monitor the wear levels of the memory blocks as states of the memory blocks in the storage 120 change. For example, the block manager 210 may monitor the wear levels of the memory blocks by calculating stress values representing the stresses applied to the respective memory blocks as erase operations are performed on the respective memory blocks. When an erase operation currently being performed on a memory block is interrupted, the block manager 210 may increment an erase interruption count, representing the number of times erase operations have been interrupted on the memory block. When the interruption is resolved, the erase operation may be resumed on the memory block.

In an embodiment, the interruption which suspends the erase operation may include suspending an erase operation to preferentially perform a different operation such as a read or write operation according to a command of a host device during the erase operation, stopping or suspending an erase operation as a result of a sudden power off (SPO) in which power supply is suddenly interrupted, and the like.

The block ranker 220 may select determined set number of blocks in ascending or descending order of the stress values of the memory blocks calculated by the block manager 210 and arrange addresses of the selected memory blocks in a list in ascending or descending order as described below.

Figure 2:
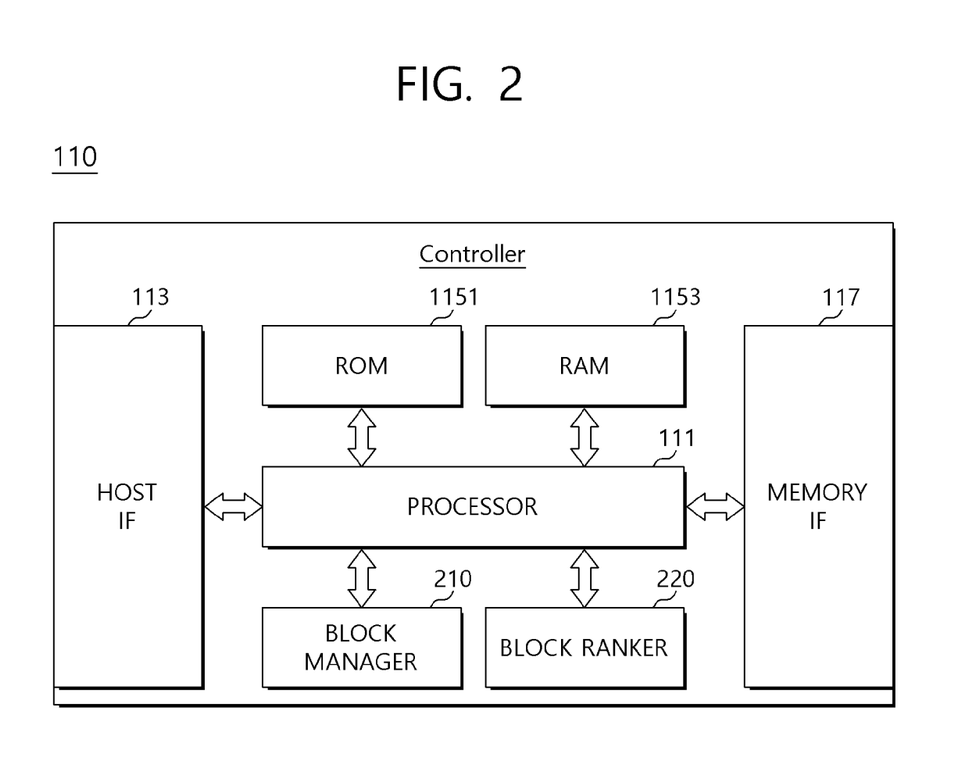
FIG. 2 is a diagram illustrating a configuration of a controller according to an embodiment of the present disclosure.

FIG. 2 is a diagram illustrating a configuration of the controller 110 according to an embodiment.

Referring to FIG. 2, the controller 110 may include a processor 111, a host interface 113, a read only memory (ROM) 1151, a random access memory (RAM) 1153, a memory interface 117, the block manager 210, and the block ranker 220.

The processor 111 may provide various functions which manage the storage 120 through the controller 110. In an embodiment, the processor 111 may control the host interface 113 and the memory interface 117 to process a write/read command provided from the host device. The processor 111 may be a microprocessor or a central processing unit (CPU) including hardware and software configured to be executed on the hardware.

The processor 111 may be configured to transmit various control information, for a read or write operation of data with respect to the storage 120, to the host interface 113, the RAM 1153, and the memory interface 117. In an embodiment, the processor 111 may be configured as a combination of hardware and software that is executed on the hardware so as to perform a function of a flash translation layer (FTL) including various functions for managing the storage 120.

The FTL may include an element configured to provide a function, for example, garbage collection, address mapping, wear leveling, and the like, an element configured to manage attributions of the plurality of memory blocks constituting the storage 120, and an error check and correction (ECC) element configured to detect and correct errors of data read out from the storage 120.

The host interface 113 may provide interfacing between the host device and the data storage device 100. The host interface 113 may receive commands and a clock signal from the host device, store and schedule the commands, and provide the clock signal and the schedule commands to the processor 111. The host interface 113 may provide write data received from the host device to the memory interface 117 or provide data received from the storage 120 through the memory interface 117 to the host device, according to control of the processor 111.

In particular, the host interface 113 may provide a physical connection between the host device and the data storage device 100. The host interface 113 may provide interfacing between the data storage device 100 and the host device according to a bus format of the host device. The bus format of the host device may include at least one among standard interface protocols such as a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI-express (PCI-E) protocol, and/or a universal flash storage (UFS) protocol.

The memory interface 117 may transmit data provided from the host interface 113 to the storage 120 or receive data read out from the storage 120 and provide the received data to the host interface 113, according to control of the processor 111. The memory interface 117 may provide a communication channel for signal exchange between the controller 110 and the storage 120.

Program codes, for example, firmware or software, for an operation of the controller 110 may be stored in the ROM 1151 and code data and the like used by the program codes may also be stored in the ROM 1151.

Data for an operation of the controller 110 may be stored in the RAM 1153 and data generated by the controller 110 may also be stored in the RAM 1153.

Figure 3:
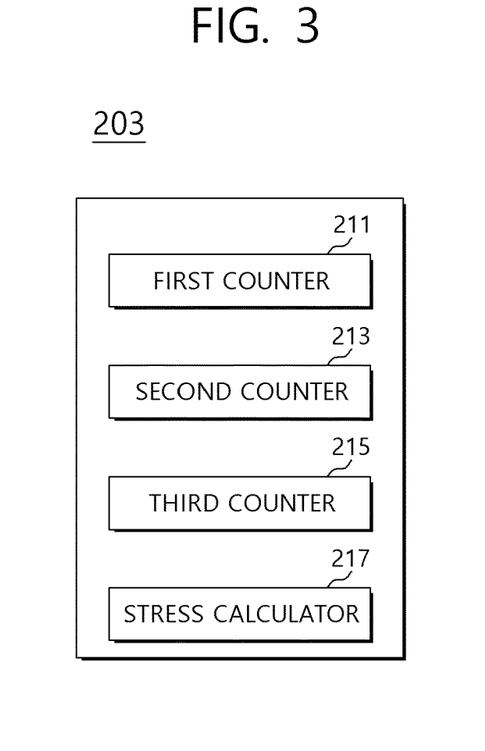
FIG. 3 is a diagram illustrating a configuration of a block manager according to an embodiment of the present disclosure.

The block manager 210 may be configured, for example, as illustrated in FIG. 3.

FIG. 3 is a diagram illustrating the block manager 210 according to an embodiment.

Referring to FIG. 3, the block manager 210 may include a first counter 211, a second counter 213, a third counter 215, and a stress calculator 217.

The first counter 211 may maintain an erase count (EC) of the number of erase operations performed on a memory block. For example, the erase count on the memory block may be increased each time an erase operation is completed on the memory block.

The following sequence may be executed during an erase operation on a memory block. First, the controller 110 may transmit an erase command to the storage 120. The storage 120 may supply an erase voltage to a target block to be erased according to the erase command received from the controller 110. After the target block is erased, the storage 120 may perform an erase verifying operation, which may determine whether or not the memory block was successfully erased, that is, whether the erase operation was successful. When the erase verifying operation is completed, it may be determined that the erase operation on the memory block is completed, and the first counter 211 may increment the erase count (EC).

The second counter 213 and the third counter 215 may count interruptions that occur during an erase operation but before the erase operation is completed on the memory block. In an embodiment, the second counter 213 may count each time erase suspension occurs during the erase operation on the memory block to generate an erase suspension count (SC), and the third counter 215 may count each time sudden power off (SPO) occurs during an erase operation on the memory block to generate a sudden power off count (SPOC).

The stress calculator 217 may calculate the erase stress value representing the erase stress applied to each memory block based on the erase count (EC), the erase suspension count (SC), and the SPO count (SPOC) counted through the first to third counters 211, 213, and 215, respectively.

The erase stress value of a memory block due to the erase operation of the memory block may be updated whenever the erase operation is completed on the memory block. As the erase count (EC) or the erase interruption count (SC and SPOC individually and/or collectively) of the memory block is increased, the electrical stress applied to the memory block may be increased. Accordingly, the controller 110 may calculate the stress value of a memory block due to the erase operation on the memory block, determine the wear level of the memory block based on the calculated stress value of the memory block, and use the wear levels of memory blocks for performing wear leveling, garbage collection, and the like on the memory blocks.

Figure 4:
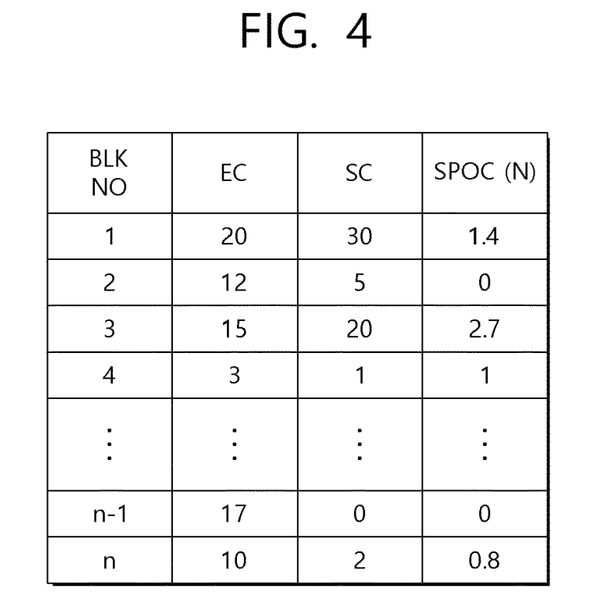
FIG. 4 is a diagram explaining a concept of calculating a stress value of a memory block according to a counting result according to an embodiment of the present disclosure.

FIG. 4 is a diagram explaining a concept of stress value calculation of a memory block based on counting results according to an embodiment.

FIG. 4 illustrates a table representing the erase count (EC), the erase suspension count (SC), and the SPO count (SPOC) of each memory block used for calculating the stress value of the memory block.

The stress calculator 217 may calculate the stress applied to the memory block (as an erase stress value) using the erase count (EC) counted by the first counter 211 and the erase suspension count (SC) and/or the SPO count (SPOC) calculated by the second counter 213 and the third counter 215 in the erase operation.

In an embodiment, a total erase stress value of a block X (Total Erase Stress 1 of Block X) may be determined as a sum of the erase count (EC) of the block X and a suspension stress value (SC×α) representing the suspend stress applied to the block X due to the erase suspension as follows.

Total Erase Stress 1 of Block X=EC+SC*α, where α=(Erase suspension latency)/(Block Erase time)

Here, the erase count (EC) of block X may be the number of times that an erase operation is completed on block X. The suspension stress value (SC×α) of block X due to erase suspension may be the erase suspension count (SC) of block X multiplied by a first weight (α).

The first weight (α) may be calculated as a ratio of an erase suspension latency to a block erase time, but this is not limited thereto. The erase suspension latency may be defined as an average amount of time taken from when the controller 110 receives a suspension command to when the erase operation on the block X is suspended in response to the suspend command. The block erase time may be an average amount of time taken to complete erase operations on memory blocks within the storage 120.

In another embodiment, the total erase stress value of block X (Total Erase Stress 2 of Block X) may be determined as a sum of the erase count (EC) of block X and a SPO stress value (SPOC(N)) representing the SPO stress applied to block X due to SPO as follows.

Total Erase Stress 2 of Block X=EC+SPOC(N), where SPOC(N)=SPOC(N−1)+β, where β=(Erase operation time)/(Block Erase time)

Here, the erase count (EC) of block X may be the number of times that an erase operation is completed on block X. The SPO stress value (SPOC(N)) of block X due to a current SPO may be a sum of a previously-calculated SPO stress value (SPOC(N−1)) and a second weight (β).

The second weight (β) may be calculated as a ratio of an erase operation time of block A to the block erase time, but this is not limited thereto. The erase operation time of the block X may be defined as the time a current erase operation is performed on the block X until suspended due to the current SPO.

For example, it is assumed that the block erase time is 10 ms. When the erase operation on memory block X proceeds and continues for 7 ms, at which time an SPO first occurs in block X (N=1). At this time, the stress value (SPOC(0)) may be assumed to be zero (0) and thus the stress value (SPOC(1)) may be the second weight (β) representing the current (i.e., first) SPO. The stress value (SPOC(1)) of memory block X due to the current (i.e., first) SPO is 0.7 (=0.7 ms/10 ms).

When SPO occurs N times, the N-th SPO stress value (SPOC(N)) on block X may be calculated as a sum of the N-1-th SPO stress value (SPOC(N−1)) on block X and the second weight (β) representing the current (i.e., N-th) SPO.

In still another embodiment, the total erase stress value of block X (Total Erase Stress 3 of Block X) may be obtained as a sum of the erase count (EC) of block X, the suspension stress value (SC×α) representing the suspend stress applied to block X due to the erase suspension, and the SPO stress value (SPOC(N)) representing the SPO stress applied to block X due to SPO as follows.

Total Erase Stress 3 of Block X=EC+SC*α+SPOC(N)

Figure 5:
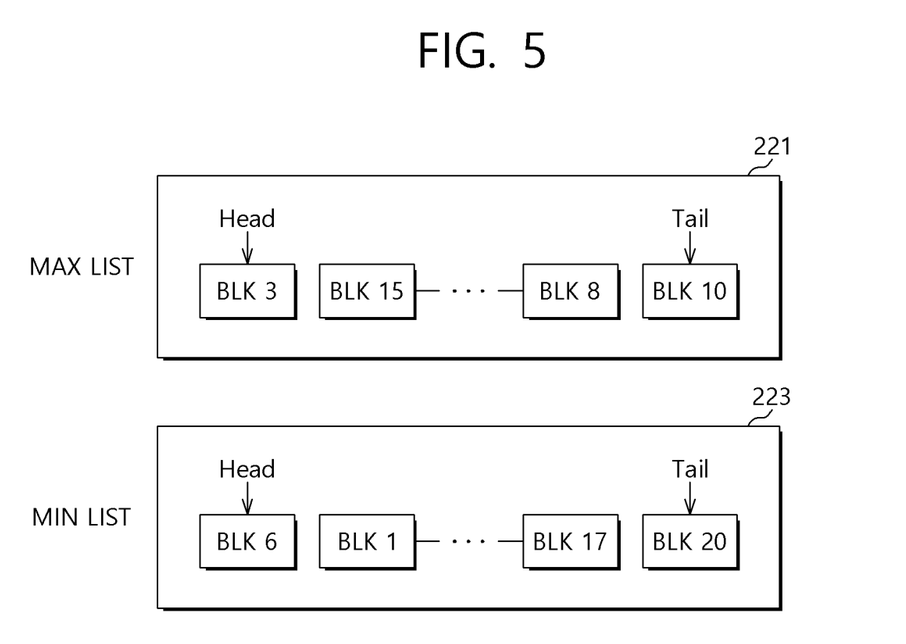
FIG. 5 is a diagram explaining a block ranker according to an embodiment of the present disclosure.

FIG. 5 is a diagram explaining the block ranker 220 according to an embodiment.

Referring to FIG. 5, the block ranker 220 may manage the memory blocks by ranking a determined number of memory blocks in ascending order and in descending order on the basis of the stress values of the blocks calculated through the block manager 210 and arranging addresses of the selected memory blocks in the form of a descending order list (MAX LIST) 221 and an ascending order list (MIN LIST) 223.

The block ranker 220 may update the lists 221 and 223 based on the stress values calculated through the block manager 210 whenever an erase operation is performed on any of the memory blocks of the storage 120.

The block ranker 220 may arrange n memory blocks starting from a memory block having the largest stress value, among the memory blocks for which stress values were calculated through the block manager 210, in descending order to form the descending order list 221. The descending order list 221 of the block ranker 220 may include a head pointer which indicates the memory block having the largest stress value in the descending order list 221 and a tail pointer which indicates the memory block having the smallest stress value in the descending order list 221.

When the descending order list 221 is updated through the block ranker 220, it may be determined that there is a memory block having a larger stress value than that of the block to which the tail pointer points. In this case, the block ranker 220 may insert that memory block into the descending order list 221, exclude the block to which the tail pointer currently points from the descending order list 221, and set the tail pointer to point to the newly inserted block.

The block ranker 220 may select and arrange n memory blocks starting from a memory block having the smallest stress value, among the memory blocks for which stress values were calculated through the block manager 210, in ascending order to form the ascending order list 223. The ascending order list 223 of the block ranker 220 may include a head pointer which indicates the memory block having the smallest stress value in the ascending order list 223 and a tail pointer which indicates the memory block having the largest stress value in the ascending order list 223.

When the ascending order list 223 is updated through the block ranker 220, it may be determined that there is a memory block having a smaller stress value than that of the block to which the tail pointer points. In this case, the block ranker 220 may insert that memory block into the ascending order list 223, exclude the memory block to which the tail pointer currently points from the ascending order list 223, and set the tail pointer to point to the newly inserted block.

The descending order list 221 and the ascending order list 223 in the block ranker 220 may be used to identify a high stress memory block or a low stress memory block.

For example, when a garbage collection operation is performed, the controller 110 may select the memory block having a relatively high or highest stress value from the descending order list 221 as a target block and move valid data stored in a source memory block to the target block. In an embodiment, the valid data, which is stored in the source memory block and is to be moved to the target block may be cold data, i.e., data which is not frequently accessed or changed. After the data stored in the source memory block is moved to the target block having a high stress value in the descending order list 221, an erase operation on the source memory block may be performed, and the list of the block ranker 220 may be updated.

In another embodiment, the controller 110 may perform a host write operation by designating the memory block having a relatively low or lowest stress value in the ascending order list 223.

In still another embodiment, when a wear-leveling operation is performed, the controller 110 may selectively designate and use the memory block having a high or highest stress value or the memory block having a low or lowest stress value. The wear-leveling may be an operation to even out write/erase operations among memory blocks having limited lifespans so that such memory blocks are more equally used. The wear-leveling operation may be performed with reference to the write/erase counts of the memory blocks.

As an example of the wear-leveling operation, the controller 110 may select the memory block having a low or lowest stress value as the target block from the ascending order list 223.

As another example of the wear-leveling operation, the controller 110 may select the source block having a low or lowest stress value from the ascending order list 223 and select the target block having a high or highest stress value from the descending order list 221. Then, the controller 110 may move data of the source block having the low stress value to the target block having the high stress value. The memory block having the low stress value may be selected from the ascending order list 223 as the source block, but the method of selecting the source block is not limited thereto. The wear-leveling operation may move data so that the memory block having the high stress value selected from the descending order list 221 is used equally to the stress value of the other blocks, and the data of the source block may be cold data to which access or change is not frequently made.

As memory block(s) is/are used in any of the operations described above, the list(s) of the block ranker 220 may be updated.

The controller 110 may arrange the memory blocks in ascending/descending order according to the stress values of the memory blocks through the block ranker 220 and represent such blocks in the ascending/descending list, and thus the time it takes to search for a memory block having a desired stress value according to an operation to be performed may be shortened.

Figure 6:
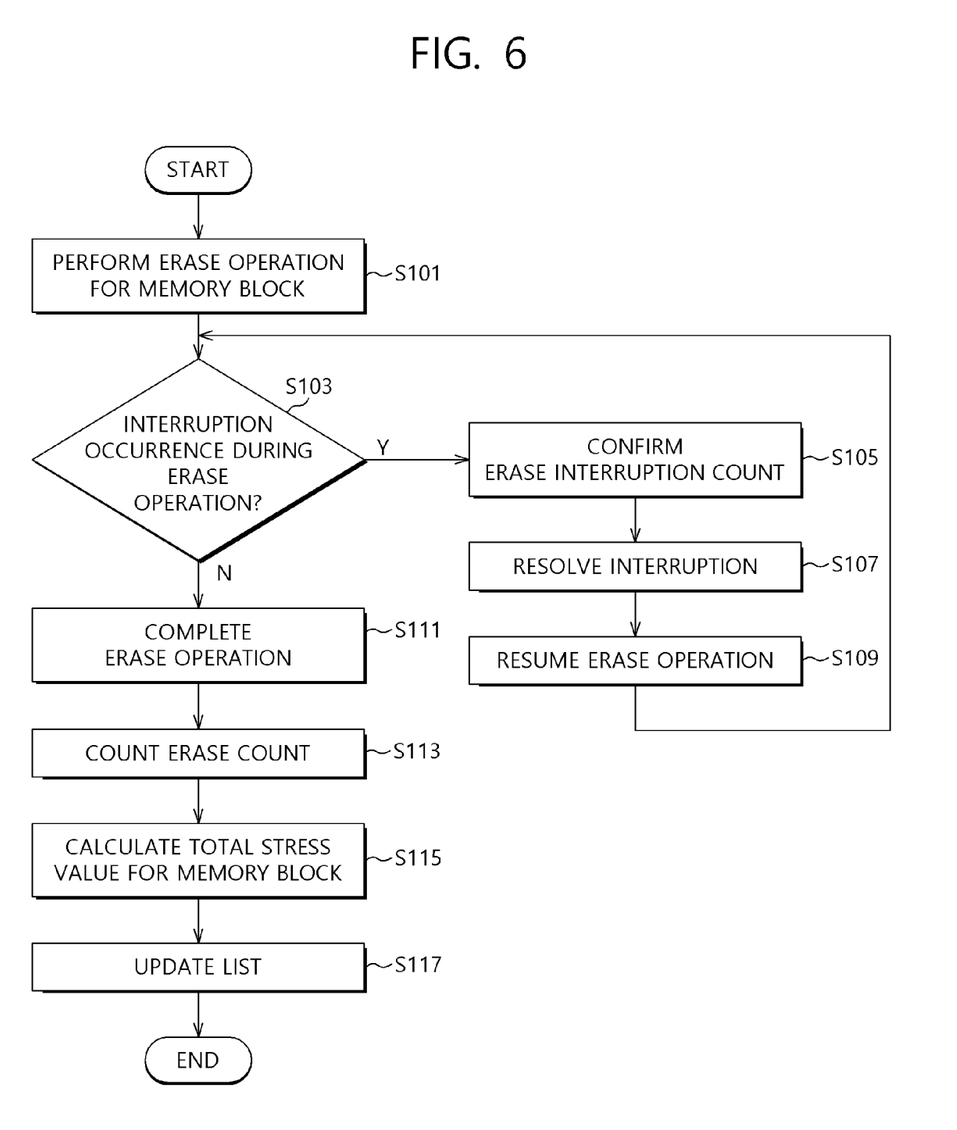
FIG. 6 is a flowchart explaining a block management method according to an embodiment of the present disclosure.

FIG. 6 is a flowchart explaining a block management method according to an embodiment.

The controller 110 may receive an erase command to perform an erase operation on a memory block (S101).

The controller 110 may determine whether or not interruption has occurred during the erase operation on the memory block (S103).

When it is determined that the interruption occurred (S103:Y), the controller 110 may confirm the erase interruption count of the memory block through the block manager 210 (S105).

After confirming the erase interruption count of the memory block through the block manager 210, the controller 110 may resolve the interruption (S107). After resolving the interruption, the controller 110 may resume the erase operation (S109).

After the erase operation resumes(S109), When the erase operation on the memory block is competed (S111) without interruption occurring(S103:N), the controller 110 may increment the erase count of the memory block (S113) and calculate the total stress value of the memory block based on the erase count (for example, erase completion count) and the erase interruption count of the memory block (S115).

After the total stress value of the memory block is calculated, the controller 110 may update the ascending order list 223 and the descending order list 211 through the block ranker 220 (S117) and terminate the block management method.

Figure 7:
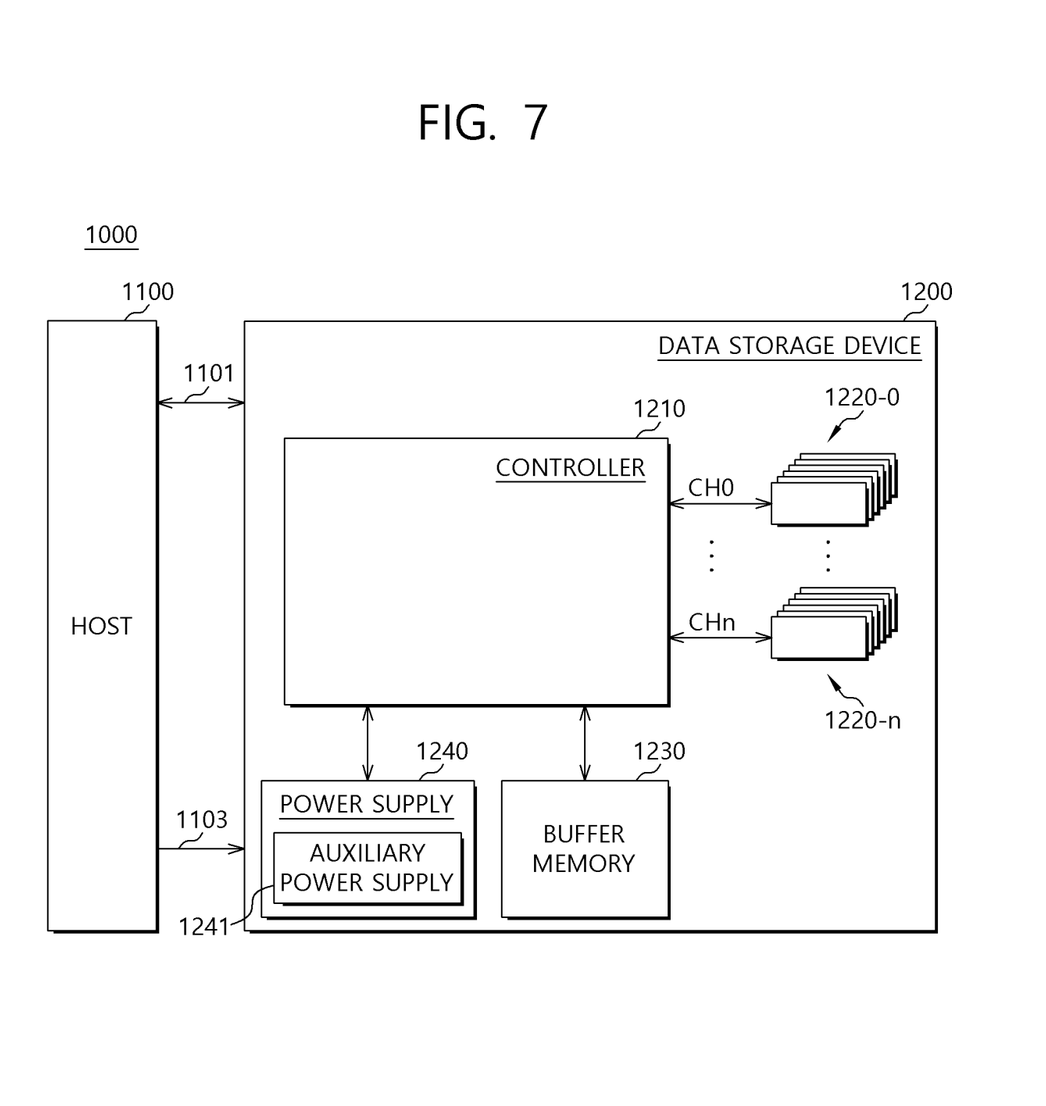
FIG. 7 is a diagram illustrating a storage system according to an embodiment of the present disclosure.

FIG. 7 is a diagram illustrating a storage system 1000 according to an embodiment.

Referring to FIG. 7, the storage system 1000 may include a host device 1100 and a data storage device 1200. In an embodiment, the data storage device 1200 may be configured of a solid state drive (SSD).

The data storage device 1200 may include a controller 1210, nonvolatile memory devices 1220-0 to 1220-n, a buffer memory device 1230, a power supply 1240, a signal connector 1101, and a power connector 1103.

The controller 1210 may control overall operation of the data storage device 1200. The controller 1210 may include a host interface, a control component, a RAM as a working memory, an ECC component, and a memory interface. For example, the controller 1210 may be the same or substantially the same as the controller 110 illustrated in FIG. 1.

The host device 1100 and the data storage device 1200 may exchange signals through the signal connecter 1101. Here, the signals may include a command, an address, and data.

The controller 1210 may analyze and process a signal inputted from the host device 1100. The controller 1210 may control operations of background function blocks according to firmware or software for driving the data storage device 1200.

The buffer memory device 1230 may temporarily store data to be stored in the nonvolatile memory devices 1220-0 to 1220-n. Further, the buffer memory device 1230 may temporarily store data read out from the nonvolatile memory devices 1220-0 to 1220-n. The data temporarily stored in the buffer memory device 1230 may be transmitted to the host device 1100 or to the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH0 to CHn, respectively. One or more nonvolatile memory devices may be coupled to one channel. The nonvolatile memory devices coupled to the same channel may be coupled to the same signal bus and the same data bus.

The power supply 1240 may provide power inputted through the power connector 1103 to the data storage device 1200. The power supply 1240 may include an auxiliary power supply 1241. The auxiliary power supply 1241 may supply power to the data storage device 1200 so that the data storage device 1200 is properly terminated when the SPO occurs. The auxiliary power supply 1241 may include large capacity capacitors, but the present invention is not limited to that configuration.

The signal connector 1101 may be configured as any of various types of connectors according to an interface scheme between the host device 1100 and the data storage device 1200.

The power connector 1103 may be configured as any of various types of connectors according to a power supply scheme of the host device 1100.

Figure 8:
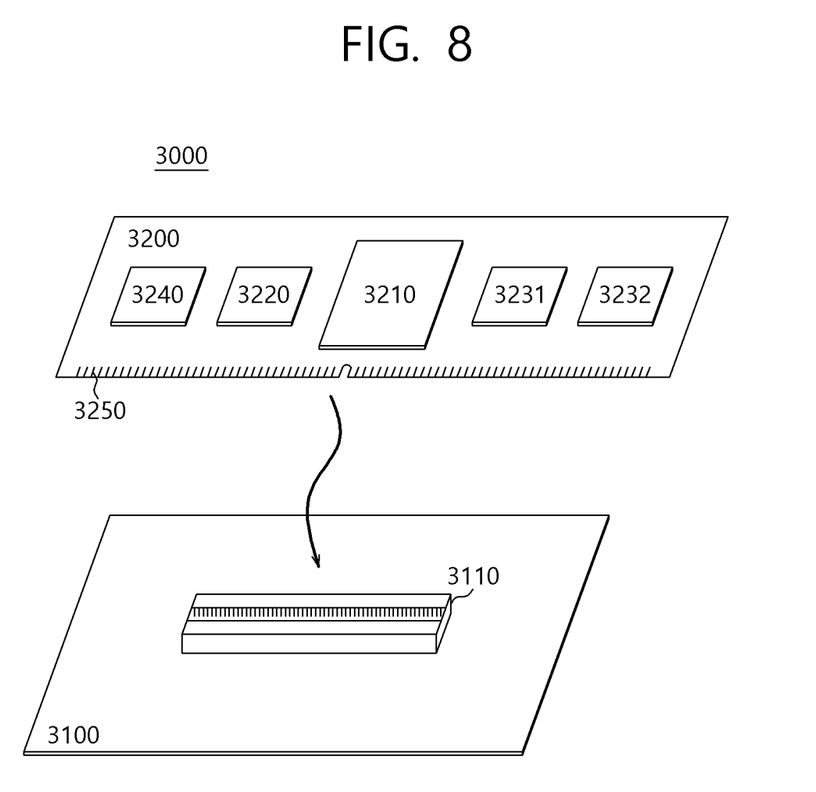
FIGS. 8 and 9 are diagrams illustrating data processing systems according to embodiments of the present disclosure.
Figure 9:
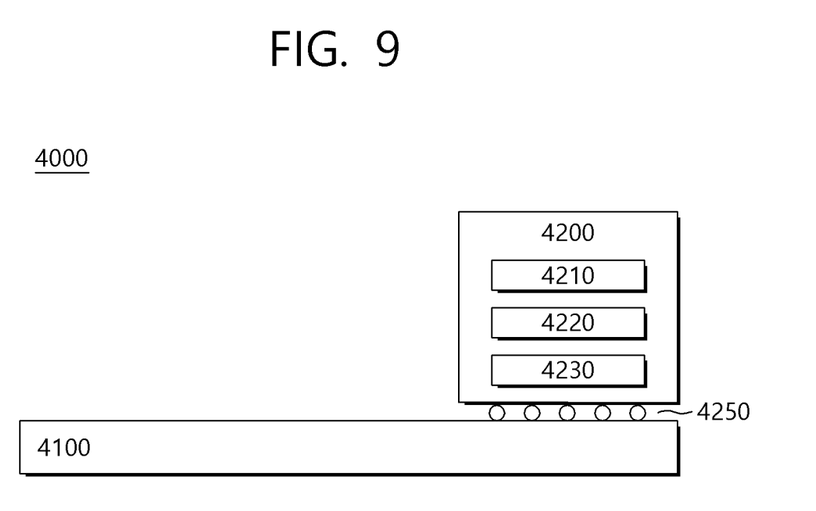

FIGS. 8 and 9 are diagrams illustrating configurations of data processing systems according to embodiments.

Referring to FIG. 8, a data processing system 3000 may include a host device 3100 and a memory system 3200.

The host device 3100 may be configured in the form of a board such as a printed circuit board. Although not shown in FIG. 8, the host device 3100 may include background function blocks for performing functions of the host device 3100.

The host device 3100 may include a connection terminal 3110 such as a socket, a slot, or a connector. The memory system 3200 may be mounted on the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control overall operation of the memory system 3200.

The controller 3210 may be the same or substantially the same as the controller 110 shown in FIG. 1.

The buffer memory device 3220 may temporarily store data to be stored in the nonvolatile memory devices 3231 and 3232. Further, the buffer memory device 3220 may temporarily store data read out from the nonvolatile memory devices 3231 and 3232. The data temporarily stored in the buffer memory device 3220 may be transmitted to the host device 3100 or to the nonvolatile memory devices 3231 and 3232 according to control of the controller 3210.

The nonvolatile memory devices 3231 and 3232 may be used as storage media of the memory system 3200.

The PMIC 3240 may provide power inputted through the connection terminal 3250 to backgrounds of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data, and the like and power may be transferred between the host device 3100 and the memory system 3200. The connection terminal 3250 may be configured as any of various types depending on an interface scheme between the host device 3100 and the memory system 3200. The connection terminal 3250 may be disposed on or in any side of the memory system 3200.

FIG. 9 illustrates a data processing system 4000 including a memory system according to an embodiment.

Referring to FIG. 9, the data processing system 4000 may include a host device 4100 and a memory system 4200.

The host device 4100 may be configured in the form of a board such as a printed circuit board. Although not shown in FIG. 9, the host device 4100 may include background function blocks for performing functions of the host device 4100.

The memory system 4200 may be configured in the form of a surface-mounting type package. The memory system 4200 may be mounted on the host device 4100 through solder balls 4250. The memory system 4200 may include a controller 4210, a buffer memory device 4220, and a nonvolatile memory device 4230.

The controller 4210 may control overall operation of the memory system 4200. The controller 4210 may be the same or substantially the same as the controller 110 shown in FIG. 1.

The buffer memory device 4220 may temporarily store data to be stored in the nonvolatile memory device 4230.

Further, the buffer memory device 4220 may temporarily store data read out from the nonvolatile memory device 4230. The data temporarily stored in the buffer memory device 4220 may be transmitted to the host device 4100 or to the nonvolatile memory device 4230 according to control of the controller 4210.

The nonvolatile memory device 4230 may be used as a storage medium of the memory system 4200.

Figure 10:
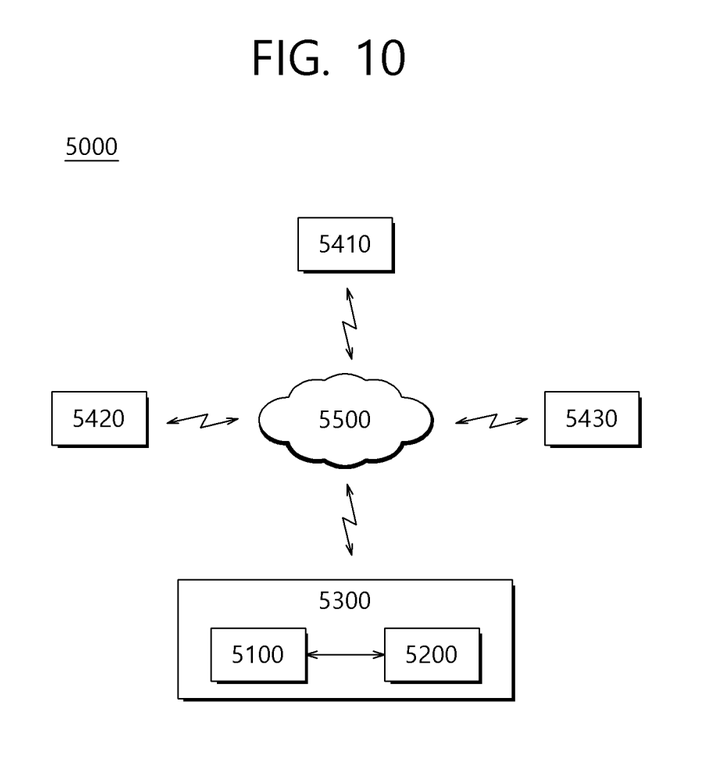
FIG. 10 is a diagram illustrating a configuration of a network system including a data storage device according to an embodiment of the present disclosure.

FIG. 10 is a diagram illustrating a configuration of a network system 5000 including a memory system according to an embodiment.

Referring to FIG. 10, the network system 5000 may include a server system 5300 and a plurality of client systems 5410 to 5430 which are coupled to each other through a network 5500.

The server system 5300 may provide data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host device 5100 and a memory system 5200. The memory system 5200 may be the data storage device 100 illustrated in FIG. 1, the data storage device 1200 illustrated in FIG. 7, the memory system 3200 illustrated in FIG. 8, or the memory system 4200 illustrated in FIG. 9.

Figure 11:
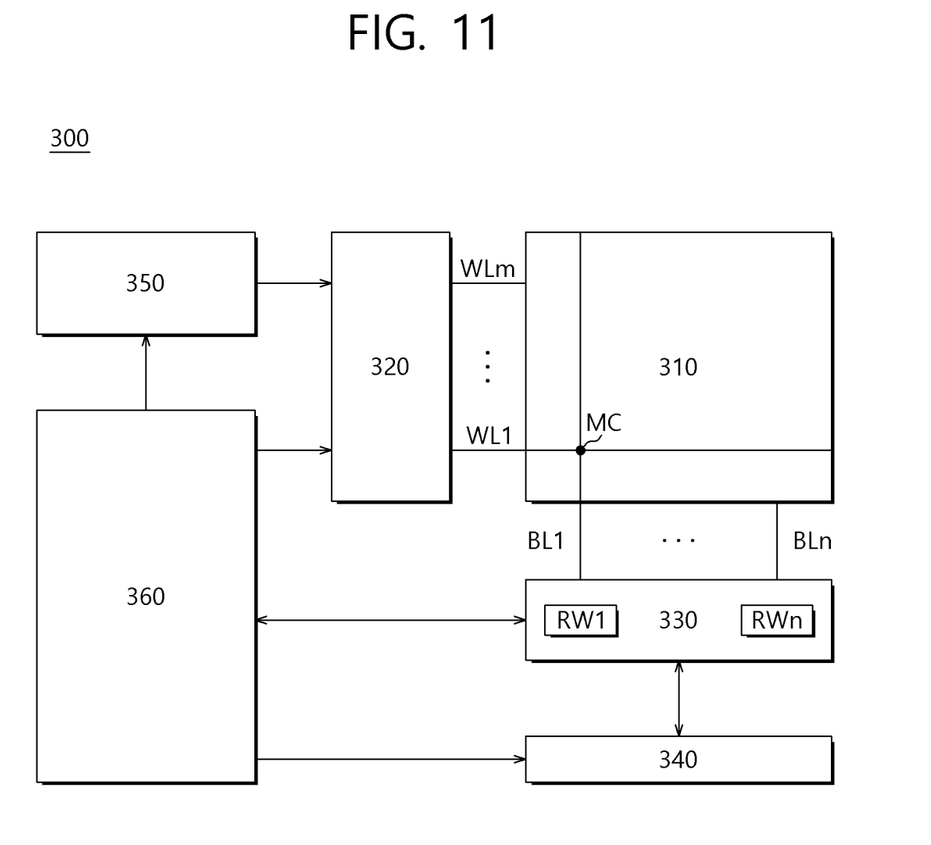
FIG. 11 is a diagram illustrating a configuration of a nonvolatile memory device included in a data storage device according to an embodiment of the present disclosure.

FIG. 11 illustrates a configuration of a nonvolatile memory device 300 included in the data storage device 100 according to the embodiment.

Referring to FIG. 11, the nonvolatile memory device 300 may include a memory cell array 310, a row decoder 320, a data read/write block 330, a column decoder 340, a voltage generator 350, and control logic 360.

The memory cell array 310 may include a plurality of memory cells MCs which are disposed in intersection regions of word lines WL1 to WLm and bit lines BL1 to BLn.

The memory cell array 310 may include a three-dimensional (3D) memory array. The 3D memory array may extend vertically with respect to a flat surface of a semiconductor substrate and may have a structure including a NAND string in which at least one memory cell is vertically disposed over another memory cell. However, the 3D memory array is not limited to that structure. More generally, any memory array which has vertical as well as horizontal dimensions and a high degree of integration may be employed as the 3D memory array.

The row decoder 320 may be coupled to the memory cell array 310 through the word lines WL1 to WLm. The row decoder 320 may operate according to control of the control logic 160. The row decoder 320 may decode addresses provided from an external device (not shown). The row decoder 320 may select and drive the word lines WL1 to WLm, based on the address decoding results. For example, the row decoder 320 may provide word line voltages provided from the voltage generator 350 to the word lines WL1 to WLm.

The data read/write block 330 may be coupled to the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as the write driver which stores data provided from the external device in the memory cell array 310 in a write operation. In another example, the data read/write block 330 may operate as the sense amplifier which reads out data from the memory cell array 310 in a read operation.

The column decoder 340 may operate according to control of the control logic 360. The column decoder 340 may decode addresses provided from the external device. The column decoder 340 may couple data input/output lines (or data input/output buffers) with the read/write circuits RW1 to RWn of the data read/write block 330 respectively corresponding to the bit lines BL1 to BLn based on the address decoding results.

The voltage generator 350 may generate voltages to be used in background operations of the nonvolatile memory device 300. The voltages generated by the voltage generator 350 may be applied to the memory cells MCs of the memory cell array 310. For example, a program voltage generated in a program operation may be applied to a word line of memory cells on which the program operation is to be performed. In another example, an erase voltage generated in an erase operation may be applied to a well region of memory cells on which the erase operation is to be performed. In still another example, a read voltage generated in a read operation may be applied to a word line of memory cells on which the read operation is to be performed.

The control logic 360 may control overall operation of the nonvolatile memory device 300, based on control signals provided from the external device. For example, the control logic 360 may control operations of the nonvolatile memory device 300 such as read, write, and erase operations of the nonvolatile memory device 300.

The above described embodiments of the present invention are intended to illustrate, not limit, the present invention. Various alternatives and equivalents are possible. The invention is not limited by the embodiments described herein. Nor is the invention limited to any specific type of semiconductor device. Other additions, subtractions, or modifications will be apparent to those skilled in the art in view of the present disclosure and are intended to fall within the scope of the appended claims.

What is claimed is:

1. A data storage device comprising:
   a storage including a plurality of memory blocks; and
   a controller configured to control operations of the plurality of memory blocks,
   wherein the controller is configured to calculate a stress value of each of the plurality of memory blocks based on an erase completion count and an erase interruption count of the corresponding memory block.

2. The data storage device of claim 1, wherein the erase interruption count is a number of times that erase suspension occurs, a number of times that sudden power off (SPO) occurs, or both, during erase of the corresponding memory block.

3. The data storage device of claim 1, wherein the controller includes:
   a block manager configured to calculate the stress value of each of the plurality of memory blocks; and
   a block ranker configured to manage an order list in which information on the plurality of blocks are ordered according to the stress value of each of the plurality of memory blocks.

4. The data storage device of claim 3, wherein the block manager includes:

a first counter configured to count a number of times an erase operation is completed on each memory block to generate the erase completion count of each memory block;

a second counter configured to count a number of times that an erase operation is suspended on each memory block to generate an erase suspension count of each memory block;

a third counter configured to count a number of times that a sudden power off (SPO) occurs on each memory block during an erase operation to generate an SPO count of each memory block; and a stress calculator configured to calculate the stress value of each memory block based on the erase completion count and at least one of the erase suspension count and the SPO count of the corresponding memory block.

5. The data storage device of claim 4,
wherein the stress calculator calculates the stress value of each memory block based on a sum of the erase completion count and a suspension stress value of the corresponding memory block, and
wherein the suspension stress value of the corresponding memory block is the erase suspension count of the corresponding memory block weighted by a first weight.

6. The data storage device of claim 5, wherein the first weight is calculated as a ratio of an erase suspension latency of the corresponding memory block to a block erase time of the corresponding memory block.

7. The data storage device of claim 5, wherein the stress calculator calculates the stress value each memory block by further adding a SPO stress value representing stress applied to the corresponding memory block due to the SPO count of the corresponding memory block.

8. The data storage device of claim 7,
wherein the SPO stress value of the corresponding block is calculated as a cumulative value of a second weight on the corresponding memory block whenever the SPO occurs during erase of the corresponding memory block, and
wherein the second weight is calculated as a ratio of an erase operation time to a block erase time of the corresponding memory block, the erase operation time being an amount of time from a start of an erase operation to a time of SPO occurrence during erase of the corresponding memory block.

9. The data storage device of claim 4,
wherein the stress calculator calculates the stress value of each memory block based on a sum of the erase completion count of the corresponding memory block and a SPO stress value representing stress applied to the corresponding memory block due to the SPO count of the corresponding memory block, and
wherein the SPO stress value of the corresponding memory block is calculated as a cumulative value of a second weight on the corresponding memory block whenever SPO occurs during erase of the corresponding memory block.

10. The data storage device of claim 9, wherein the second weight is a ratio of an erase operation time to a block erase time of the corresponding memory block, the erase operation time being an amount of time from start of an erase operation to a time of SPO occurrence during the erase of the corresponding memory block.

11. An operating method of a data storage device which includes a storage including a plurality of memory blocks and a controller configured to control operations of the plurality of memory blocks, the method comprising:
executing an erase operation on at least one memory block;
counting a number of times erase of the at least one memory block is interrupted to generate an erase interruption count of the at least one memory block;
processing each interruption and resuming the interrupted erase operation;
counting a number of times erase operations are completed on the at least one memory block to generate an erase completion count for the at least one memory block; and
calculating a stress value representing stress applied to the at least one memory block based on the erase completion count and the erase interruption count of the at least one memory block.

12. The method of claim 11, further comprising updating an ascending order list and a descending order list in which information on a set number of memory blocks among the plurality of memory blocks are arranged in ascending order and in descending order, respectively, according to the stress values of the set number of memory blocks.

13. The method of claim 11, wherein the erase interruption count is a number of times that erase suspension occurs, a number of times that sudden power off (SPO) occurs, or both, during the erase of the at least one memory block.

14. The method of claim 11, wherein the calculating of the stress value includes:
counting a number of times erase is suspended to generate an erase suspension count and counting a number of times erase is interrupted by a sudden power off (SPO) to generate an SPO count of the at least one memory block; and
calculating the stress value of the at least one memory block based on the erase completion count, the erase suspension count and the SPO count.

15. The method of claim 11, wherein the stress value of the at least one memory block is calculated based on a sum of the erase completion count of the at least one memory block and a suspension stress value of the at least one memory block.

16. The method of claim 15,
wherein the suspension stress value is the erase suspension count of the at least one memory block weighted by a first weight, and
wherein the first weight is calculated as a ratio of an erase suspension latency of the at least one memory block to a block erase time of the at least one memory block.

17. The method of claim 15, wherein the stress value of the at least one memory block is calculated by further adding a SPO stress value representing stress applied to the at least one memory block due to the SPO count,
wherein the SPO stress value is calculated as a cumulative value of a second weight on the at least one memory block whenever SPO occurs during erase of the at least one memory block, and
wherein the second weight is calculated as a ratio of an erase operation time to a block erase time of the at least one memory block, the erase operation time being an amount of time from the start of the corresponding erase operation to SPO occurrence during erase of the at least one memory block.

18. The method of claim 11,
wherein the stress value of the at least one memory block is calculated based on a sum of an erase completion count of the least one memory block and a SPO stress value representing stress applied to the at least one memory block due to the SPO count, and wherein the SPO stress value is calculated as a cumulative value of a second weight on the at least one memory block whenever SPO occurs during erase of the at least one memory block.

19. The method of claim 18, wherein the second weight is calculated as a ratio of an erase operation time to a block erase time of the at least one memory block, the erase operation time being an amount of time from start of the erase operation to a time of SPO occurrence during erase of the at least one memory block.

20. An operating method of a data storage device which includes a controller, the operating method comprising:

updating an ordered list whenever a storage completes an erase operation on a memory block therein; and controlling the storage to perform an operation on a memory block selected from the ordered list, wherein the list includes information on memory blocks, which information is arranged in ascending or descending order with respect to respective stresses applied to memory blocks in the storage, and wherein the stress applied to a memory block is represented by one of the following equations 1 to 3:

$$stress=EC+SC*(erase\ suspension\ latency)/(block\ erase\ time) \quad \text{[equation 1]}$$

where EC is the number of erase operations completed on the memory block; SC is a number of times that erase operations are suspended on the memory block; the erase suspension latency is an average amount of time taken to suspend an erase operation on the memory block in response to a suspension command; and the block erase time is an average amount of time taken to complete the erase operations on the memory blocks in the storage, $$stress=EC+\Sigma\{(Erase\ operation\ time)/(Block\ Erase\ time)\} \quad \text{[equation 2]}$$

where $\Sigma\{$(Erase operation time)/(Block Erase time)$\}$ is summation of a ratio of erase operation time to the block erase time for sudden power offs that occurred during erase operations on the memory block; and the erase operation time is an amount of time taken to perform an erase operation on the memory block until the erase operation on the memory block is suspended due to each sudden power off, and $$stress=EC+SC*\alpha+\Sigma\{(Erase\ operation\ time)/(Block\ Erase\ time)\} \quad \text{[equation 3]}.$$

* * * * *